(12) United States Patent
Park et al.

(10) Patent No.: US 11,177,070 B2
(45) Date of Patent: Nov. 16, 2021

(54) ELECTRIC SHOCK PROTECTION DEVICE, METHOD FOR MANUFACTURING SAME, AND PORTABLE ELECTRONIC DEVICE HAVING SAME

(71) Applicant: AMOTECH CO., LTD., Namdong-gu (KR)

(72) Inventors: Kyu Hwan Park, Yongin-si (KR); Jun Suh Yu, Yeonsu-gu (KR)

(73) Assignee: AMOTECH CO., LTD.

( * ) Notice: Subject to any disclaimer, the term of this patent is extended or adjusted under 35 U.S.C. 154(b) by 117 days.

(21) Appl. No.: 16/495,773

(22) PCT Filed: Mar. 26, 2018

(86) PCT No.: PCT/KR2018/003507
§ 371 (c)(1),
(2) Date: Sep. 19, 2019

(87) PCT Pub. No.: WO2018/182249
PCT Pub. Date: Oct. 4, 2018

(65) Prior Publication Data
US 2020/0111611 A1  Apr. 9, 2020

(30) Foreign Application Priority Data

Mar. 29, 2017  (KR) .......................... 10-2017-0039967
Mar. 29, 2017  (KR) .......................... 10-2017-0039971

(51) Int. Cl.
*H01G 2/22* (2006.01)
*H01C 7/12* (2006.01)
(Continued)

(52) U.S. Cl.
CPC ................. *H01G 2/22* (2013.01); *H01C 7/12* (2013.01); *H01G 2/14* (2013.01); *H01G 4/40* (2013.01)

(58) Field of Classification Search
CPC .. H01G 4/40; H01G 2/22; H01G 2/14; H01G 4/30; H01G 4/232; H01C 7/12; H05F 3/04
(Continued)

(56) References Cited

U.S. PATENT DOCUMENTS 5,870,273 A * 2/1999 Sogabe ..................... H01G 4/40
361/306.3
2015/0083477 A1 * 3/2015 Lee ......................... H01G 4/232
174/260
(Continued)

FOREIGN PATENT DOCUMENTS

JP   61-020739   6/1986
JP   10-125557   5/1998
(Continued)

*Primary Examiner* — Arun Ramaswamy
(74) *Attorney, Agent, or Firm* — K&L Gates LLP

(57) ABSTRACT

Provided are an electric shock protection device and method of manufacturing the same. The electric shock protection device may include a capacitor unit comprising multiple sheet layers and multiple capacitor electrodes provided on the sheet layers and has an electric shock prevention function and a communication signal transmission function; a pair of soldering electrodes formed on the sheet layer disposed at an outermost side among the sheet layers, extend from both ends toward a center of the capacitor unit, and are formed as electrodes for co-firing; a pair of terminal electrodes provided at both ends of the sheet layers and connecting the capacitor electrodes to the pair of soldering electrodes; a varistor connected to the pair of soldering electrodes through solders and formed as a single component; and a molding portion molded on the varistor, the pair of soldering electrodes, and one side of each of the terminal electrodes.

10 Claims, 9 Drawing Sheets

(51) Int. Cl.
*H01G 2/14* (2006.01)
*H01G 4/40* (2006.01)

(58) Field of Classification Search
USPC ...... 361/321.1, 321.2, 301.4, 272, 328, 329,
361/330, 321.3, 275.1, 306.3
See application file for complete search history.

(56) References Cited

U.S. PATENT DOCUMENTS

2015/0340154 A1* 11/2015 Kim .................. H01G 4/248
174/260
2016/0149398 A1* 5/2016 Kim .................. G06F 1/1656
307/326
2016/0293335 A1* 10/2016 Adachi .................. H01G 4/40

FOREIGN PATENT DOCUMENTS

KR  10-2015-0135909  12/2015
KR  10-1578544       12/2015
KR  10-2016-0118143  10/2016

\* cited by examiner

ELECTRIC SHOCK PROTECTION DEVICE, METHOD FOR MANUFACTURING SAME, AND PORTABLE ELECTRONIC DEVICE HAVING SAME

CROSS-REFERENCE TO RELATED APPLICATIONS

The present application is a 35 U.S.C. 371 national phase entry of PCT/KR2018/003507, filed Mar. 26, 2018, which claims the benefit of Korea Patent Application 10-2017-0039967 filed Mar. 29, 2017 and Korea Patent Application 10-2017-0039971 filed Mar. 29, 2017, all of which are hereby incorporated by reference in their entireties.

TECHNICAL FIELD

The present invention relates an electric shock protection device for an electronic device such as a smartphone, and more specifically, to an electric shock protection device capable of simultaneously improving resistance to electrostatic discharge (ESD), temperature characteristics, and a capacitance capacity, a method of manufacturing the same, and a portable electronic device including the same.

BACKGROUND

Recently, metal housings have been increasingly adopted for portable electronic devices to improve aesthetics and robustness of the portable electronic devices.

However, since the metal housings have high electric conductivity which is a characteristic of the material, electrical paths may be generated between external housings and internal circuit parts through specific elements or according to portions thereof.

Particularly, since loops are formed through the metal housings and the circuit parts, in a case in which static electricity having a high voltage is instantaneously introduced through conductors such as the metal housings having externally exposed large areas, the circuit parts such as integrated circuits (ICs) and the like are damaged, or leakage currents generated due to alternating current (AC) power are transmitted to the metal housings through ground parts of the circuit parts and make users uncomfortable. In severe cases, since the leakage currents cause electric shocks that may injure the users, countermeasures thereagainst are required.

Furthermore, in the case of the static electricity, since the static electricity is more easily introduced into pointed portions having pointed shapes than into flat portions due to characteristics of the static electricity, resistance to static electricity needs to be further strengthened therefor.

Meanwhile, since the portable electronic devices essentially have communication functions, the portable electronic devices need high capacitance so as to stably process communication signals without attenuation, and particularly, need various capacitances according to positions on circuit boards.

In this situation, in a case in which varistor type devices are used as electric shock protection devices having static electricity protection functions, resistance to static electricity may be strengthened, but it is difficult to obtain the high capacitances, and since a varistor material has high temperature change rates due to characteristics thereof, in a case in which the varistor type devices are combined with other components and used, overall temperature characteristics are degraded.

Accordingly, countermeasures are urgently required for blocking leakage currents in portable electronic devices, strengthening resistance to static electricity for each position, at which static electricity is easily introduced, obtaining various high capacitances, and for temperature stability.

SUMMARY

The present invention is directed to providing an electric shock protection device in which a static electricity protection function and a capacitor function are separately provided and which is packaged as a single component so that resistance to static electricity, temperature characteristics, and a capacitance capacity may be improved simultaneously, a method of manufacturing the same, and a portable electronic device including the same.

One aspect of the present invention provides an electric shock protection device including a capacitor unit which includes a plurality of sheet layers and a plurality of capacitor electrodes provided on the sheet layers and has an electric shock prevention function and a communication signal transmission function; a pair of soldering electrodes which are formed on the sheet layer disposed at an outermost side among the plurality of sheet layers, extend from both ends toward a center of the capacitor unit, and are formed as electrodes for co-firing; a pair of terminal electrodes which are provided at both ends of the plurality of sheet layers and connect the plurality of capacitor electrodes to the pair of soldering electrodes; a varistor which is connected to the pair of soldering electrodes through solders and is formed as a single component; and a molding portion which is molded on the varistor, the pair of soldering electrodes, and one side of each of the terminal electrodes.

The electrode for co-firing may include Ag and Pd, or Ag and Pt, and the pair of terminal electrodes may include at least one among Ag, Pt, Pd, Cu, and Ni.

The pair of soldering electrodes may be spaced 100 μm or more from each other, and a distance between the pair of soldering electrodes may be less than a distance between external electrodes of the varistor.

A thickness of the molding portion may range from 20 μm to 50 μm greater than a thickness of the varistor, and the thickness of the varistor may be greater than a thickness of the capacitor unit.

The pair of terminal electrodes may include first portions which are provided to cover parts of the soldering electrodes, second portions which are opposite to the first portions and are provided to cover parts of one surface of the capacitor unit, and third portions which connect the first portions and the second portions.

A width of the first portion may be the same as a width of the second portion, the width may be 50 μm or more, and a distance between the first portions of the pair of terminal electrodes may be greater than or equal to a length of the varistor.

The varistor may include a plurality of varistor layers, at least two first internal electrodes provided on one varistor layer among the plurality of varistor layers and spaced a predetermined distance from each other, at least one second internal electrode provided on a varistor layer, which is different from the plurality of first internal electrodes, and a pair of external electrodes which are provided at both sides of the plurality of varistor layers and in which one of the first internal electrodes and the second internal electrodes is connected to one of the pair of external electrodes.

Another aspect of the present invention provides an electric shock protection device including a capacitor unit which includes a plurality of sheet layers and a plurality of capacitor electrodes provided on the sheet layers and has an electric shock prevention function and a communication signal transmission function; a varistor unit which includes a plurality of varistor layers, at least two first internal electrodes which are provided on the same varistor layer among the plurality of varistor layers and spaced a predetermined distance from each other, and at least one second internal electrode which is provided on a varistor layer, which is different from the plurality of first internal; an insulating layer provided between the capacitor unit and the varistor unit; and a pair of external electrodes which are provided at both sides of the capacitor unit and the varistor unit and in which one among the plurality of capacitor electrodes, the first internal electrodes, and the second internal electrode is connected to one of the pair of terminal electrodes.

The insulating layer may include an epoxy.

Still another aspect of the present invention provides a portable electronic device including a conductor including a pointed portion formed to protrude outward from a conductive case, a circuit part, and an electric shock protection device which electrically connects the conductor and the circuit part. Here, the electric shock protection device may be an electric shock protection device having the above-described structures and characteristics according to the various embodiments.

The conductor may include a side key, and the pointed portion may include one end of an insertion hole of a connector which is connected to an external device.

Yet another aspect of the present invention provides a method of manufacturing an electric shock protection device, the method including stacking a plurality of sheet layers on which capacitor electrodes are provided, applying an electrode paste for co-firing on the sheet layer disposed at an outermost side among the plurality of sheet layers from both ends toward a center of the plurality of sheet layers, firing the plurality of sheet layers, forming a pair of terminal electrodes at the both ends of the plurality of sheet layers such that a pair of soldering electrodes formed of the electrode paste for co-firing are connected to the plurality of capacitor electrodes, soldering a varistor formed as a single component onto the pair of soldering electrodes, and molding a molding member on the varistor, the pair of soldering electrodes, and one side of each of the terminal electrodes.

The electrode paste for co-firing may include Ag and Pd, or Ag and Pt.

The applying may include applying the paste such that, after the firing, the pair of soldering electrodes are spaced 100 µm or more from each other, and a distance between the pair of soldering electrodes is less than a distance between external electrodes of the varistor.

The forming of the terminal electrodes may include forming the pair of terminal electrodes such that first portions cover parts of the soldering electrodes, second portions face the first portions and cover a part of one surface of the sheet layer disposed at the outermost side, and third portions connect the first portions to the second portions.

The forming of the terminal electrodes may include forming the terminal electrodes such that a width of the first portion is the same as a width of the second portion, the width is 50 or more, and a distance between the first portions of each of the pair of terminal electrodes is greater than or equal to a length of the varistor.

According to embodiments of the present invention, since a varistor and a capacitor are separately provided and are packaged as a single package, resistance to static electricity is strengthened, and a capacitance capacity is also increased, and thus product reliability can be improved.

In addition, in the present invention, since the varistor formed as a single component is stacked on and coupled to a capacitor unit, a manufacturing process is simplified, and a lineup for various capacities is facilitated, and thus manufacturing efficiency can be improved and a manufacturing cost can be reduced.

In addition, in the present invention, since the varistor and the capacitor are separately formed, a degree of design freedom is increased when capacitance is obtained, and thus the lineup for the various capacitances is possible and a requirement of a customer can be quickly responded to without an additional process change.

In addition, in the present invention, since the varistor, which is a single component, and the capacitor are coupled by soldering and molded into the single package, the varistor and the capacitor can be protected and also standardized such that a total chip size has a predetermined size, and a pick-up workability can be improved in the manufacturing process, and thus a separate effort for picking up a target object is not required so that the manufacturing efficiency can be further improved.

DETAILED DESCRIPTION

Figure 1:
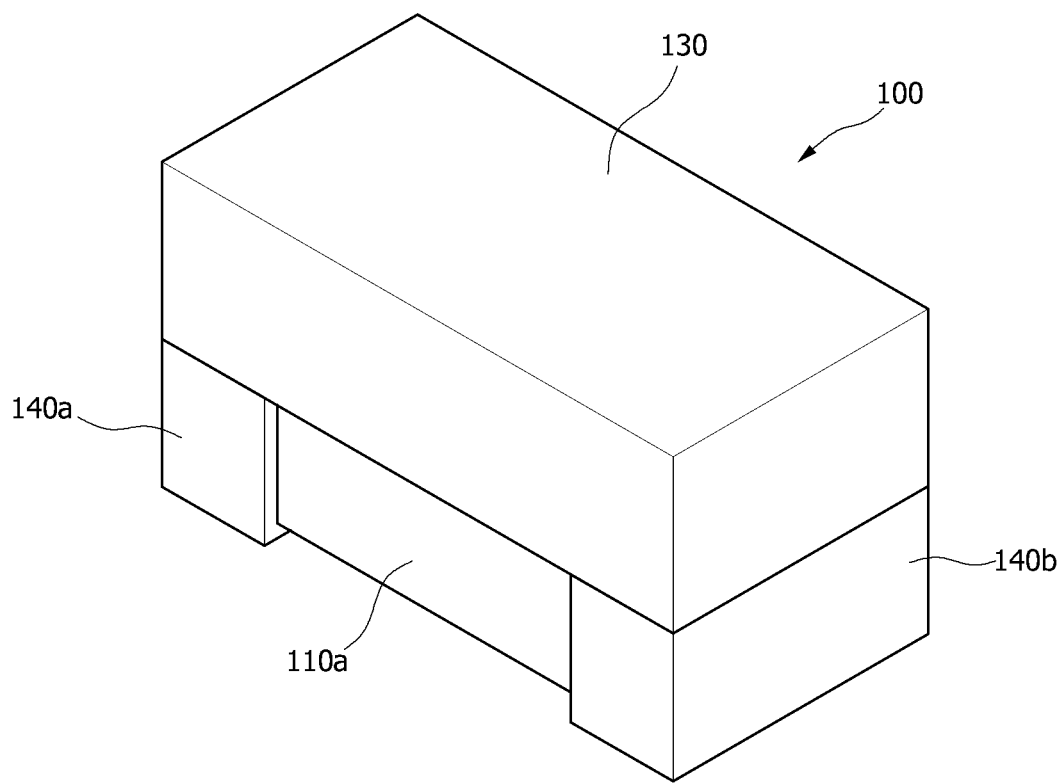
FIG. 1 is a perspective view illustrating an electric shock protection device according to one embodiment of the present invention.

Hereinafter, embodiments of the present invention that are easily performed by those skilled in the art will be described in detail with reference to the accompanying drawings. The present invention may be implemented in several different forms and is not limited to the embodiments described herein. Parts irrelevant to the description are omitted in the drawings in order to clearly explain the embodiments of the present invention, and similar parts are denoted by similar reference numerals throughout this specification.

An electric shock protection device according to one embodiment of the present invention includes a capacitor unit, a varistor unit, and connecting members, and the capacitor unit and the varistor unit are spaced a predetermined distance from each other. As described above, in the present invention, since the capacitor unit and the varistor unit are spaced apart from each other and formed as one chip, degradation of physical characteristics between the capacitor and the varistor may be prevented.

Figure 2:
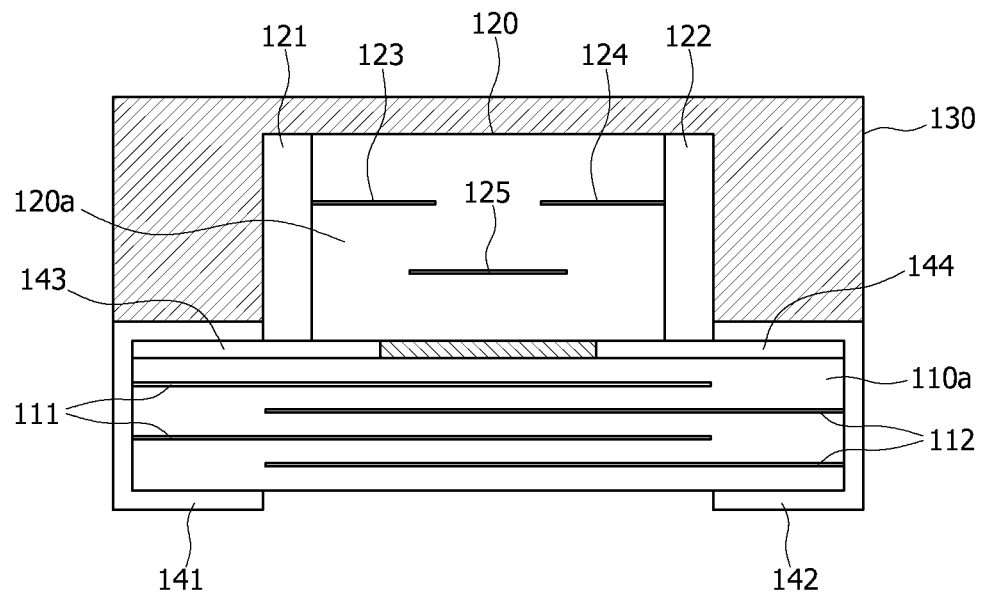
FIG. 2 is a cross-sectional view illustrating the electric shock protection device according to one embodiment of the present invention.
Figure 3:
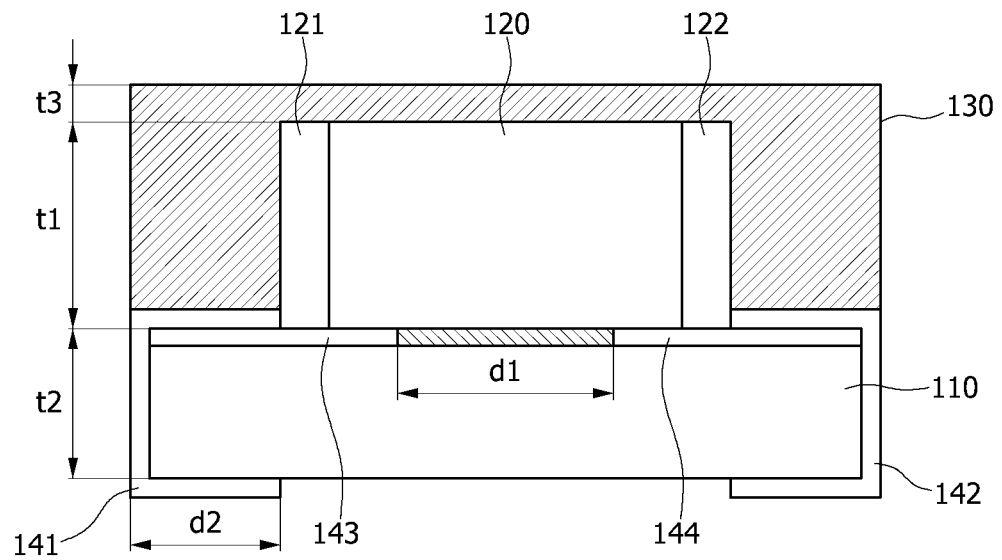
FIG. 3 is a cross-sectional view illustrating distances between electrodes, widths of the electrodes, and thicknesses of a varistor, a capacitor, and a molding portion in the electric shock protection device according to one embodiment of the present invention.

As an example, as illustrated in FIGS. 1 to 3, an electric shock protection device 100 according to one embodiment of the present invention includes a capacitor unit 110, a varistor 120, a molding portion 130, terminal electrodes 141 and 142, and soldering electrodes 143 and 144.

Here, connecting members include the terminal electrodes 141 and 142, and the soldering electrodes 143 and 144, and a varistor unit is formed as a single component.

The capacitor unit 110 includes a plurality of sheet layers 110a and a plurality of capacitor electrodes 111 and 112 provided on the sheet layers 110a and has an electric shock prevention function and a communication signal transmission function.

Here, the plurality of sheet layers 110a-1 to 110a-5 may include insulating materials having dielectric constants and may preferably include ceramic materials. As an example, the ceramic material may include a metal based oxide compound including at least one selected from among Er2O3, Dy2O3, Ho2O3, V2O5, CoO, MoO3, SnO2, BaTiO3, and Nd2O3.

As described above, since the capacitor unit 110 is formed of a dielectric, in a case in which the electric shock protection device 100 is used in an portable electronic device of which temperature is severely changed due to frequent use, a temperature characteristic of the varistor 120 of which a change rate of temperature is relatively high is supplemented, and temperature characteristics of an entire package can be stabilized, and thus product reliability can be improved.

In addition, since the capacitor unit 110 is formed separately from the varistor 120, a capacitance can be obtained independently of a varistor material having a high change rate of temperature, and a degree of design freedom for the capacitance is increased, and thus a lineup for various capacitances can be possible even without an additional process change, and a requirement of a customer can be quickly responded to without an additional process change Accordingly, the capacitor unit 110 may transmit a communication signal for each band corresponding to communication objectives without attenuation.

Figure 4:
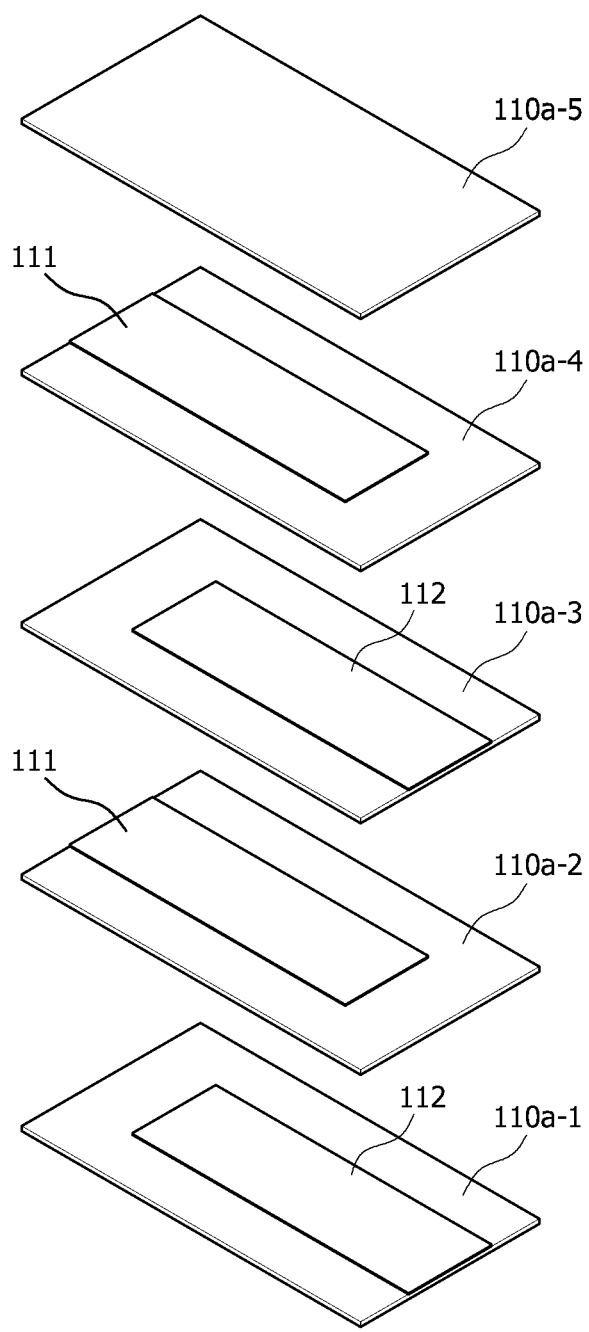
FIG. 4 is an exploded perspective view illustrating a stacking relationship in a capacitor unit of FIG. 2.

As illustrated in FIG. 4, the plurality of sheet layers 110a-1 to 110a-5 may be sequentially stacked in the capacitor unit 110. Here, the sheet layers 110a-1 to 110a-5 may be alternately stacked such that the capacitor electrodes 111 and the capacitor electrodes 112 are provided at symmetrical positions.

Here, the capacitor unit 110 may have a dielectric breakdown voltage Vcp which is greater than a rated voltage Vin of an external power source. Accordingly, in a case in which a leakage current is introduced due to the external power source, the capacitor unit 110 may block a direct current (DC) component included in the leakage current to prevent an electric shock of a user.

The varistor 120 is formed as a single component manufactured in advance. That is, the varistor 120 may be the single component having characteristics required according to a portion of the portable electronic device to which the electric shock protection device 100 is applied.

Here, since the electric shock protection device 100 includes the separate capacitor unit 110, a capacitance does not need to be obtained by the varistor 120. Particularly, since a change rate of temperature of a varistor material forming the varistor 120 is relatively high, a capacitance is changed according to a temperature when the capacitance is provided in the varistor 120, and thus a capacitance of an entire package of the electric shock protection device 100 may be adversely affected. Accordingly, the varistor 120 may be the single component manufactured to have the capacitance which is less than that of the capacitor unit 110.

Figure 7:
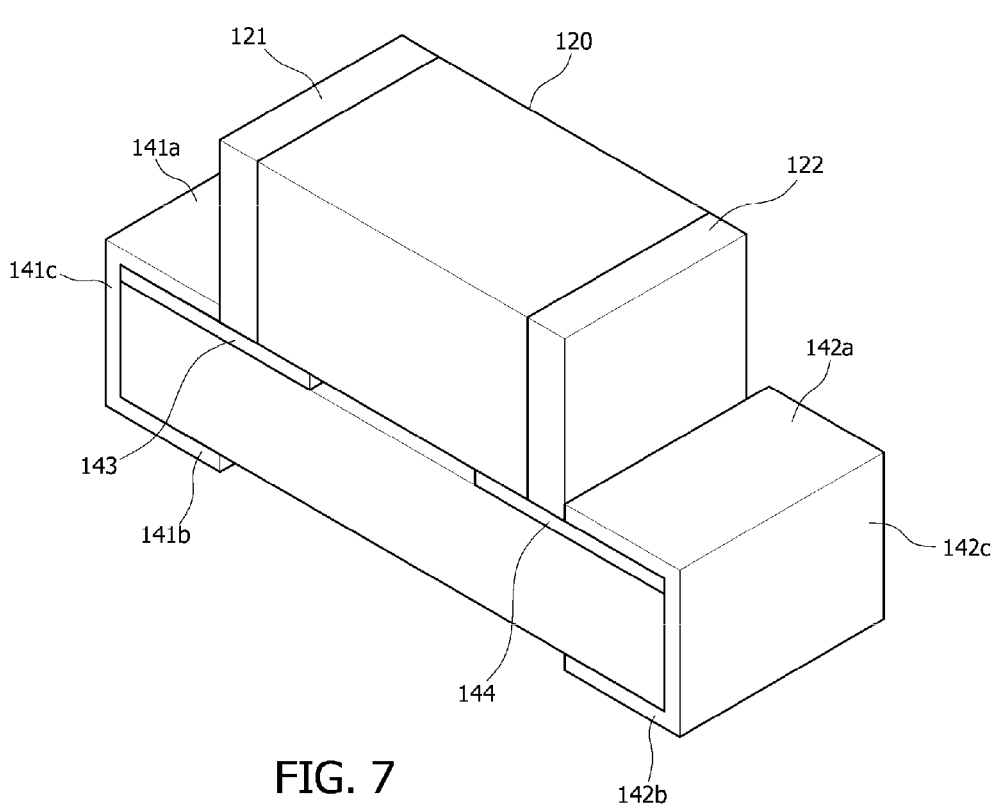
FIG. 7 is a perspective view illustrating a state in which the varistor is soldered onto the capacitor unit of FIG. 6.

As illustrated in FIG. 7, the varistor 120 is mounted on the soldering electrodes 143 and 144 through soldering as described below and is accordingly connected to the soldering electrodes 143 and 144 using a solder.

As illustrated in FIG. 2, the varistor 120 may include a varistor layer 120a, external electrodes 121 and 122, first internal electrodes 123 and 124, and a second internal electrode 125.

The varistor layer 120a is formed of a varistor material and may include a semi-conductive material including at least one among, for example, ZnO, SrTiO3, BaTiO3, and SiC, or one of a Pr based material and a Bi based material.

The pair of external electrodes 121 and 122 are provided at both sides of the plurality of varistor layers 120a, and each of the external electrodes 121 and 122 is connected to one of the first internal electrodes 123 and 124 and the second internal electrode 125 which are withdrawn to the both sides of the varistor layer 120a.

In FIG. 2, it is illustrated and described that the number of first internal electrodes 123 and 124 are two, the number of second internal electrodes 125 is one, and the first internal electrodes 123 and 124 are withdrawn to the both sides of the varistor layer 120a and connected to the external electrodes 121 and 122, but the present invention is not limited thereto.

As an example, the first internal electrode 123 may be connected to the external electrode 121, and a second internal electrode (not shown) may be connected to the external electrode 122 according to the number of first internal electrodes 123 and 124 and the number of second internal electrodes 125, that is, in a case in which the number of the first internal electrodes 123 and 124 is the same as the number of second internal electrodes 125.

The first internal electrodes 123 and 124 are provided to be spaced a predetermined distance from each other on one varistor layer among the plurality of varistor layers 120a, and the number of the first internal electrodes 123 and 124 is at least two. As an example, the first internal electrodes 123 and 124 are connected to the external electrodes 121 and 122 and spaced the predetermined distance from each other.

The second internal electrode 125 is provided on the varistor layer 120a, which is different from the plurality of first internal electrodes 123 and 124, and the number of the second internal electrode 125 is at least one. As an example, in a case in which two first internal electrodes 123 and 124 are provided as illustrated in FIG. 2, only one second internal electrode 125 may be disposed between the first internal electrodes 123 and 124 in a cross-sectional view of the electric shock protection device 100.

Here, it is illustrated and described that the first internal electrodes 123 and 124 face the second internal electrode 125 and parts thereof overlap, but the present invention is not limited thereto, and the first internal electrodes 123 and 124 and the second internal electrode 125 may also be disposed such that the first internal electrodes 123 and 124 and the second internal electrode 125 do not overlap.

In addition, in a case in which the number of internal electrodes between the external electrodes 121 and 122 is three or more, the second internal electrode (not shown) may be disposed to be spaced predetermined distances from the first internal electrode 124 and the second internal electrode 125, and the first internal electrodes 123 and 124 and the second internal electrode 125 may be repeatedly disposed to have the above-described structure.

Here, the distance between the first internal electrodes 123 and 124 may be greater than distances from the first internal electrodes 123 and 124 to the second internal electrode 125. Accordingly, an introduced signal such as static electricity may be sequentially transmitted to the first internal electrode 123, the second internal electrode 125, and the first internal electrode 124.

Here, in the varistor 120, the distances from the pair of first internal electrodes 123 and 124 to the second internal electrode 125 and a particle size of the varistor material may be provided to satisfy a breakdown voltage Vbr. Here, the breakdown voltage Vbr of the varistor 120 is a total sum of breakdown voltages between the first internal electrodes 123 and 124 and the second internal electrode 125 and may be greater than the rated voltage Vin of the external power source so as to block a leakage current caused by the external power source.

Accordingly, in a case in which static electricity is introduced into the varistor 120, since a voltage of the static electricity is greater than the breakdown voltage Vbr, the varistor 120 is turned on so that the static electricity can pass therethrough, and in a case in which a leakage current caused by the external power source is introduced, since the breakdown voltage Vbr is greater than the rated voltage of the external power source, the varistor 120 is turned off so that the leakage current can be blocked.

In addition, a thickness t1 of the varistor 120 may be greater than a thickness t2 of the capacitor unit 110. That is, since the varistor 120 uses a conventionally manufactured standardized product, the size thereof is limited, but the thickness of the capacitor unit 110 may be adjusted to be smaller than the thickness of the varistor 120 such that a total size of the electric shock protection device 100 is the same as a total size of a conventional component.

Here, since the capacitor unit 110 and the varistor 120 are separately manufactured, various capacitance capacities can be obtained according to a type of the sheet layer 110a and the number of and a distance between the capacitor electrodes 111 and 112, and the electric shock protection device 100 can also be formed to have a small thickness.

As described above, since the varistor 120 and the capacitor unit 110 are separately manufactured and are formed as one chip, degradation of temperature characteristics and varistor characteristics can be prevented when compared to a case in which a varistor and a capacitor unit are formed in a sheet layer having different materials through one process and formed as one chip.

More specifically, in a case in which the varistor and the capacitor unit are stacked using different materials, characteristics such as dielectric constants of the sheet layers are changed due to diffusion and substitution of material components which occur at a boundary surface between the different materials when fired. Particularly, since the varistor material having a high change rate of temperature affects a dielectric of the capacitor unit, it is difficult to secure a capacitance tolerance of the capacitor unit, and thus the varistor characteristics are degraded.

However, in the electric shock protection device 100 according to the embodiment of the present invention, since the varistor 120 uses a conventional component and only the capacitor unit 110 is separately fired, degradation of characteristics between the varistor 120 and the capacitor unit 110 can be prevented, and thus the varistor can have inherent high resistance to electrostatic discharge (ESD), stable temperature characteristics can also be provided, and a desired high capacitance can also be easily obtained.

Figure 5:
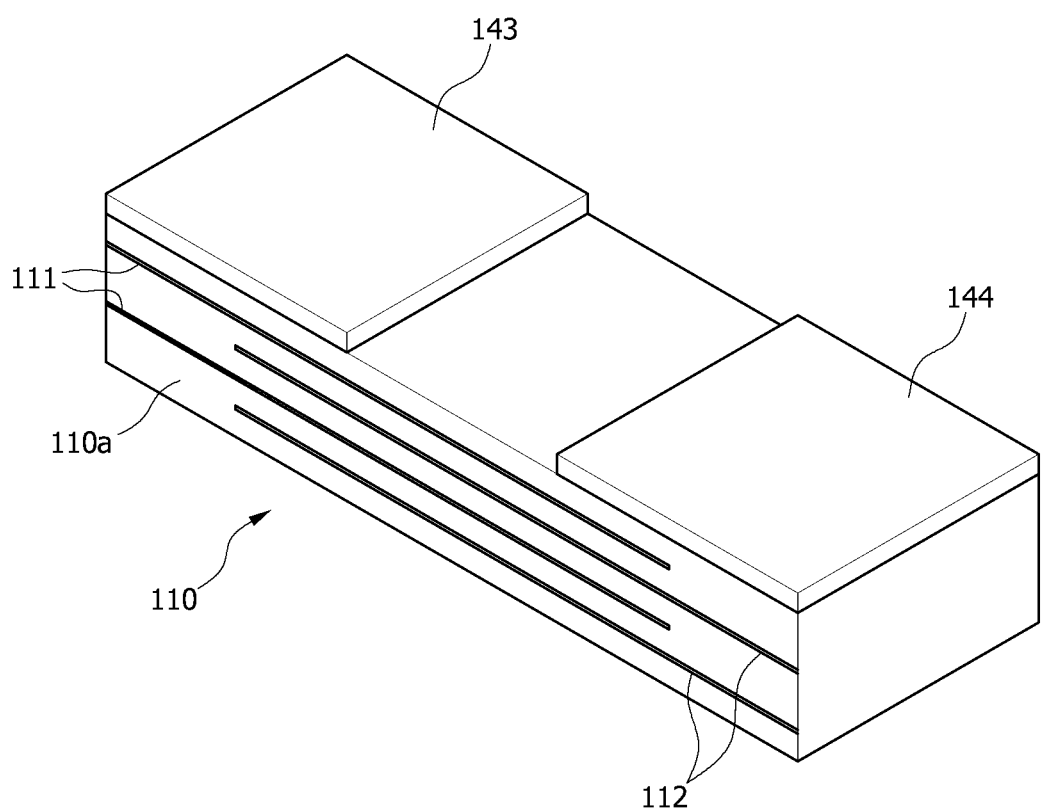
FIG. 5 is a perspective view illustrating a state in which a soldering electrode is provided on the capacitor unit of FIG. 4.

As illustrated in FIG. 5, the soldering electrodes 143 and 144 are provided on the sheet layer 110a-5 disposed at an outermost side, that is, an uppermost sheet layer among the plurality of sheet layers 110a, and a pair of soldering electrodes 143 and 144 are formed. The soldering electrodes 143 and 144 are for coupling the varistor 120 to the capacitor unit 110 through soldering and are formed to extend from both ends of the capacitor unit 110 toward a center thereof to be connected to the external electrodes 121 and 122.

Here, the soldering electrodes 143 and 144 are electrodes for co-firing and include materials capable of being soldered after firing. Here, the soldering electrodes 143 and 144 may be the electrodes for co-firing capable of being soldered immediately after firing without using an additional plating process. As an example, the electrodes for co-firing may include Ag and Pd, or Ag and Pt.

Accordingly, since the varistor 120 may be soldered immediately after firing of the capacitor unit 110, the separate plating process can be omitted, a manufacturing process can be simplified, manufacturing efficiency can be improved, and a manufacturing cost can be reduced.

The pair of soldering electrodes 143 and 144 may be disposed to be spaced 100 μm or more from each other such that ESD does not occur. That is, since the pair of soldering electrodes 143 and 144 are formed to be coplanar with each other, and a gap is structurally generated therebetween, there is a high possibility that ESD occurs through the gap. Accordingly, a distance between the pair of soldering electrodes 143 and 144 may be sufficiently increased such that the ESD does not occur.

Here, the distance d1 between the pair of soldering electrodes 143 and 144 may be less than a length of the varistor 120 such that the varistor 120 is mounted on the pair of soldering electrodes 143 and 144, and particularly, may be less than a distance between the external electrodes 121 and 122 of the varistor 120 (see FIG. 2).

Thus, the distance between the pair of soldering electrodes 143 and 144 may be greater than 100 μm and less than the distance between the external electrodes 121 and 122 of the varistor 120.

The terminal electrodes 141 and 142 are provided at both ends of the plurality of sheet layers 110a and connect the plurality of capacitor electrodes 111 and 112 to the pair of soldering electrodes 143 and 144, and a pair of terminal electrodes 141 and 142 are formed.

Figure 6:
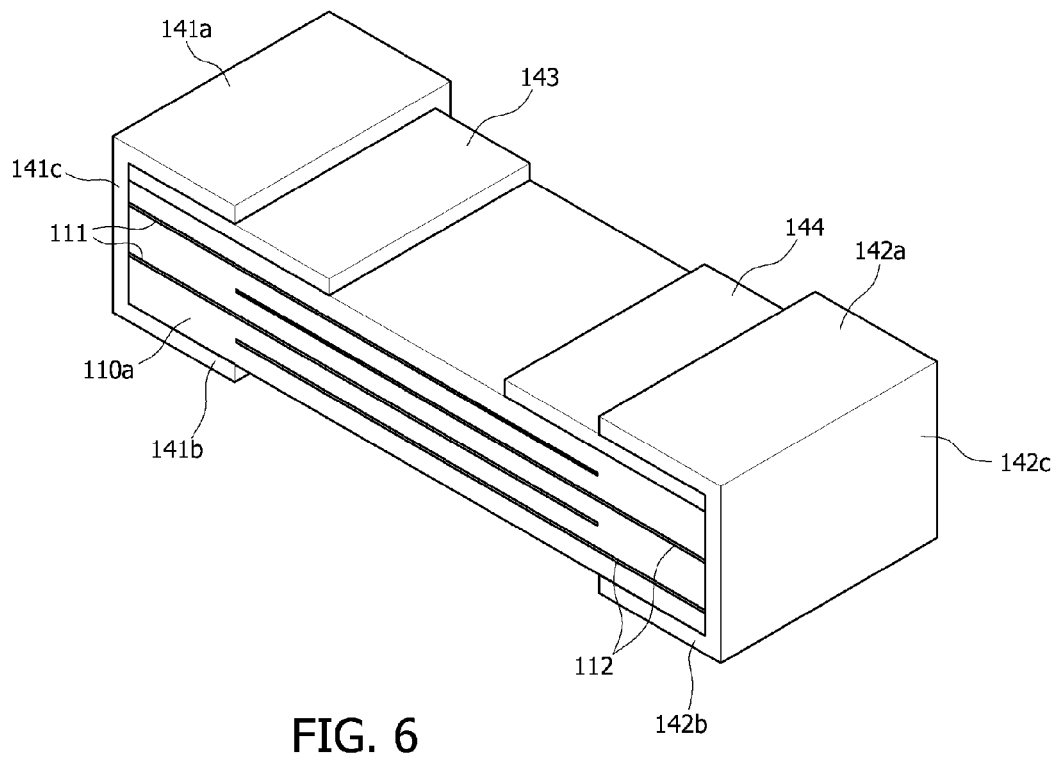
FIG. 6 is a perspective view illustrating a state in which terminal electrodes are provided at both sides of the capacitor unit of FIG. 5.

The terminal electrodes 141 and 142 are electrodes for soldering the electric shock protection device 100 to a circuit board, and, as illustrated in FIG. 6, may include first portions 141a and 142a, second portions 141b and 142b, and third portions 141c and 142c.

The first portions 141a and 142a may be provided to cover parts of the soldering electrodes 143 and 144 from above the capacitor unit 110. Here, the first portions 141a and 142a are formed to have same shapes as those of the second portions 141b and 142b, and widths thereof may be 50 µm or more. Here, a distance between the first portions 141a and 142a may be greater than or equal to the length of the varistor 120 such that the varistor 120 can be coupled to the soldering electrodes 143 and 144.

The second portions 141b and 142b may be provided to be opposite to the first portions 141a and 142a and cover parts of the capacitor unit 110 from under the capacitor unit 110. That is, the second portions 141b and 142b may be provided to cover a part of a lower surface of the sheet layer 110a-1 disposed at the outermost side of the capacitor unit 110. Here, the width d2 of each of the second portions 141b and 142b may be 50 µm or more such that second portions 141b and 142b can be easily soldered onto the circuit board (see FIG. 2)

The third portions 141c and 142c may be provided to connect the first portions 141a and 142a and the second portions 141b and 142b at both sides of the capacitor unit 110.

As described above, the terminal electrodes 141 and 142 are formed to have "a" shapes in a cross-sectional view of the terminal electrodes 141 and 142 (see FIGS. 2 and 3), may be formed to have plate shapes, and may connect the first portions 141a and 142a and the second portions 141b and 142b at a front surface and a rear surface, which are perpendicular to the third portions 141c and 142c, of the capacitor unit 110 (see FIG. 7).

In addition, the pair of terminal electrodes 141 and 142 may include at least one among Ag, Pt, Pd, Cu, and Ni. Here, the pair of terminal electrodes 141 and 142 may further include a glass component to improve adhesiveness of the electrodes. Here, in a case in which a glass component is included in the sheet layer 110a of the capacitor unit 110, the glass component may not be included in the pair of terminal electrodes 141 and 142 or a content of the glass component may be decreased therein.

As described above, since the capacitor electrodes 111 and 112 and the soldering electrodes 143 and 144 are connected by the terminal electrodes 141 and 142 exposed to the both sides of the capacitor unit 110, resistance to static electricity can be improved when compared to a case of being connected through via holes.

More specifically, in a case in which the varistor and the capacitor unit are separately manufactured and via holes are formed to pass through the capacitor unit so as to connect the capacitor electrodes and the varistor such that the varistor and the capacitor unit are formed as one chip, since conductive materials do not uniformly fill the via holes, unexpected gaps are formed in connecting portions between the via holes and the electrodes. Here, ESD may occur due to the gaps formed in the connecting portions between the connecting electrodes and the via holes for connecting the capacitor electrodes, the external electrodes, and the varistor, and thus damage can occur to the components.

However, in the electric shock protection device 100 according to the embodiment of the present invention, since the capacitor unit 110 is connected to the varistor 120 by the terminal electrodes 141 and 142 through the capacitor electrodes 111 and 112 and the soldering electrodes 143 and 144 at the both sides of the capacitor unit 110, inhomogeneity of the connecting portions due to a problem in a manufacturing process can be suppressed, and thus ESD due to the electrode connecting portions can be prevented, and resistance to static electricity can be improved.

In addition, the capacitor unit 110 and the varistor 120 may be connected in parallel by the pair of terminal electrodes 141 and 142 and the pair of soldering electrodes 143 and 144.

Accordingly, since the capacitor unit 110 and the varistor 120 selectively operate with respect to static electricity, a leakage current of the external power source, and a communication signal, the capacitor unit 110 and the varistor 120 may perform a static electricity protection function, an electric shock prevention function, and a communication signal transmission function.

The molding portion 130 is molded on the varistor 120, the pair of soldering electrodes 143 and 144, and one sides of the terminal electrodes 141 and 142. That is, the molding portion 130 is molded to cover an upper side of the capacitor unit 110 and the varistor 120. As an example, the molding portion 130 may include an epoxy.

Here, a thickness of the molding portion 130 may range from 20 µm to 50 µm greater than the thickness t1 of the varistor 120. That is, a thickness t3 between the upper surface of the varistor 120 and an upper surface of the molding portion 130 may range from 20 µm to 50 µm.

Here, in a case in which the thickness t3 between the upper surface of the varistor 120 and the upper surface of the molding portion 130 is less than 20 µm, the molding portion 130 may not provide a sufficient function of covering and protecting the upper surface of the varistor 120. That is, since the molding portion 130 and the varistor 120 are formed of different materials, the molding portion 130 may be broken so that there is a possibility that the varistor 120 can be externally exposed.

In addition, in a case in which the thickness t3 between the upper surface of the varistor 120 and the upper surface of the molding portion 130 is 50 µm or more, the molding portion 130 does not have an effect on protection function, and it is difficult to satisfy a standard for a total size of the electric shock protection device 100.

As described above, since the capacitor unit 110 and the varistor 120 are molded and formed as a single package, even in a case in which the capacitor unit 110 and the varistor 120 are protected and the varistor 120, which is formed as the single component having various capacitances and characteristics, is used, a total size of the chip may be standardized to be a predetermined size. Accordingly, since a pick-up workability can be improved in a manufacturing process, manufacturing efficiency can be further improved without an additional effort for picking up the electric shock protection device.

In addition, since the capacitor unit 110 and the varistor 120 are independently formed of different materials without being affected by each other, resistance to static electricity is strengthened, and a capacitance capacity is increased, and thus product reliability can be improved.

Particularly, since an influence between the capacitor unit 110 and the varistor 120 is eliminated, the distance between the capacitor electrodes 111 and 112 which are stacked in the capacitor unit 110 may be further decreased, and thus a high capacitance can be easily obtained by increasing the number of stacked capacitor electrodes or using the sheet layer 110a having a high dielectric constant.

Hereinafter, a method of manufacturing an electric shock protection device according to an embodiment of the present invention will be described with reference to FIG. 8.

Figure 8:
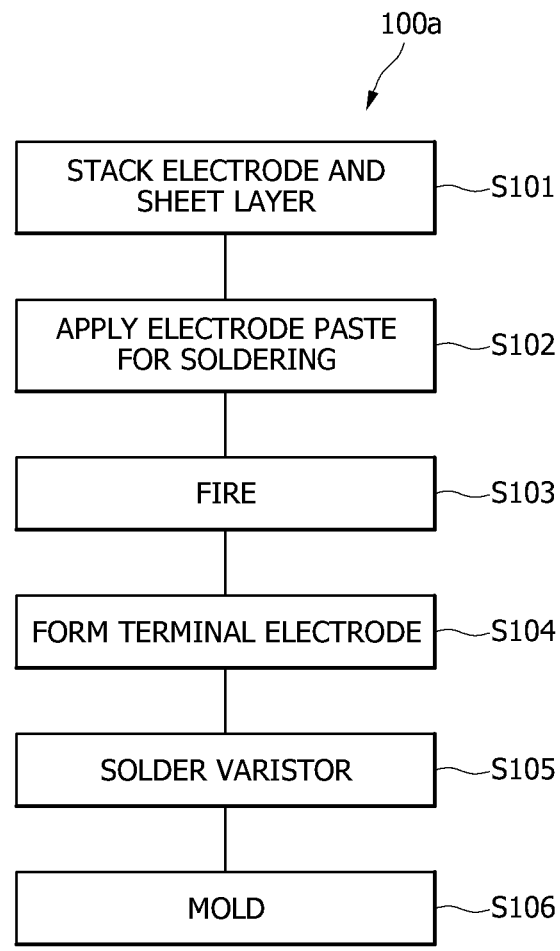
FIG. 8 is a flowchart for describing a method of manufacturing an electric shock protection device according to one embodiment of the present invention.

As illustrated in FIG. 8, the method of manufacturing the electric shock protection device 100a according to the embodiment of the present invention includes stacking the capacitor electrodes 111 and 112 and the sheet layer 110a (S101), applying a soldering electrode paste on the sheet layer 110a (S102), firing (S103), forming the terminal electrodes 141 and 142 (S104), soldering the varistor 120 (S105), and molding (S106).

More specifically, the plurality of sheet layers 110a-1 to 110a-5 on which the capacitor electrodes 111 and 112 are provided are stacked (S101). That is, the plurality of sheet layers 110a-1 to 110a-5 may be sequentially stacked. In this case, the sheet layers, which each include the capacitor electrode 111 or the capacitor electrode 112 disposed at symmetrical positions, may be alternately stacked (see FIG. 4). Here, the sheet layers 110a-1 to 110a-5 may include insulating materials having dielectric constants and may preferably include ceramic materials.

Next, the electrode paste for co-firing is applied on the sheet layer 110a-5 disposed at the outermost side of the plurality of sheet layers 110a-1 to 110a-5 (S102). Here, the electrode paste for co-firing may include a material capable of being soldered after firing. That is, the electrode paste for co-firing may be a paste capable of being soldered onto the formed electrodes immediately after firing without using an additional plating process.

In this case, in a case in which the electrodes are formed of a general paste, since soldering is difficult immediately after firing and an additional plating process is required, the soldering electrodes 143 and 144 are formed of the electrode paste for co-firing for ease of process. As an example, the electrode paste for co-firing may include Ag and Pd, or Ag and Pt.

Here, the electrode paste for co-firing is for forming the soldering electrodes 143 and 144 through firing and is applied in directions from both ends toward a center of the plurality of sheet layers 110a such that the soldering electrodes 143 and 144 are connected to the external electrodes 121 and 122 (see FIG. 5).

In this case, in order to prevent ESD due to the pair of soldering electrodes 143 and 144, which are formed of the electrode paste for co-firing after firing, the electrode paste for co-firing may be applied such that the soldering electrodes 143 and 144 are spaced 100 µm or more from each other after firing (see FIG. 3).

In addition, the electrode paste for co-firing may be applied such that the distance d1 between the pair of soldering electrodes 143 and 144 formed after firing so as to mount the varistor 120 thereon may be less than the length of the varistor 120, and particularly, less than the distance between the external electrodes 121 and 122 of the varistor 120.

Thus, the electrode paste for co-firing may be applied such that the distance between the pair of soldering electrodes 143 and 144 is greater than 100 µm and less than the distance between the external electrodes 121 and 122 of the varistor 120.

Next, the plurality of sheet layers 110a are fired (S103). In this case, sintered pellets of the plurality of sheet layers 110a are formed through firing, the capacitor electrodes 111 and 112 and the capacitor unit 110 are formed, and the pair of soldering electrodes 143 and 144 are formed of the electrode paste for co-firing (see FIG. 5).

Next, the pair of terminal electrodes 141 and 142 are formed at both ends of the plurality of sheet layers 110a (S104). Here, the pair of terminal electrodes 141 and 142 connect the pair of soldering electrodes 143 and 144 formed of the electrode paste for co-firing and the plurality of capacitor electrodes 111 and 112.

In this case, the first portions 141a and 142a which cover the parts of the soldering electrodes 143 and 144, the second portions 141b and 142b which are opposite to the first portions 141a and 142a and cover one surface of the sheet layer 110a-1 disposed at the outermost side, and the third portions 141c and 142c which connect the first portions 141a and 142a and the second portions 141b and 142b.

Here, the terminal electrodes 141 and 142 may be formed such that each of the first portions 141a and 142a and the second portions 141b and 142b has the same width which is 50 µm or more. In addition, each of the second portions 141b and 142b may be formed to have the width d2 of 50 µm or more to be easily soldered onto the circuit board (see FIG. 2).

In addition, the distance between the first portions 141a and 142a may be greater than or equal to the length of the varistor 120 such that the varistor 120 can be coupled to the soldering electrodes 143 and 144.

Next, the varistor 120 formed as a single component is soldered onto the pair of soldering electrodes 143 and 144 (S105). In this case, the varistor 120 and the capacitor unit 110 may be connected in parallel by the pair of soldering electrodes 143 and 144 and the terminal electrodes 141 and 142.

Next, a molding member is molded on the varistor 120, the pair of soldering electrodes 143 and 144, and one sides of the terminal electrodes 141 and 142 (S106). That is, the molding member is molded to cover the upper side of the sheet layer 110a and the varistor 120. As an example, the molding member may include an epoxy.

In this case, the molding portion 130 formed through molding may be formed to range from 20 µm to 50 µm greater than the thickness t1 of the varistor 120. That is, the molding portion 130 may be formed such that the thickness t3 between the upper surface of the varistor 120 and the upper surface of the molding portion 130 ranges from 20 µm to 50 µm.

The electric shock protection device 100 may be manufactured through the above-described method.

As described above, since the varistor formed as a single component is coupled to the capacitor unit through soldering, a manufacturing process can be simplified by substantially using only a capacitor forming process and a package process, and thus manufacturing efficiency can be improved, and a manufacturing cost can also be reduced.

As another embodiment, in an electric shock protection device 200 according to the embodiment of the present invention, a varistor unit and a capacitor unit are separately provided and stacked to have the same areas, and a connecting member includes terminal electrodes provided at both sides of a capacitor unit 210 and a varistor unit 220, and the varistor unit and the capacitor unit are connected in parallel by the terminal electrodes without a separate connecting member.

As illustrated in FIGS. 9 to 12, the electric shock protection device 200 includes the capacitor unit 210, the varistor unit 220, an insulating layer 230, and terminal electrodes 241 and 242.

The capacitor unit 210 includes a plurality of sheet layers 210a and a plurality of capacitor electrodes 211 and 212 provided on each of the sheet layers and has an electric shock prevention function and a communication signal transmission function. Since the capacitor unit 210 is the same as the capacitor unit 110 of the electric shock protection device 100 described with reference to FIGS. 1 to 7, a specific description about the capacitor unit 210 will be omitted.

Figure 9:
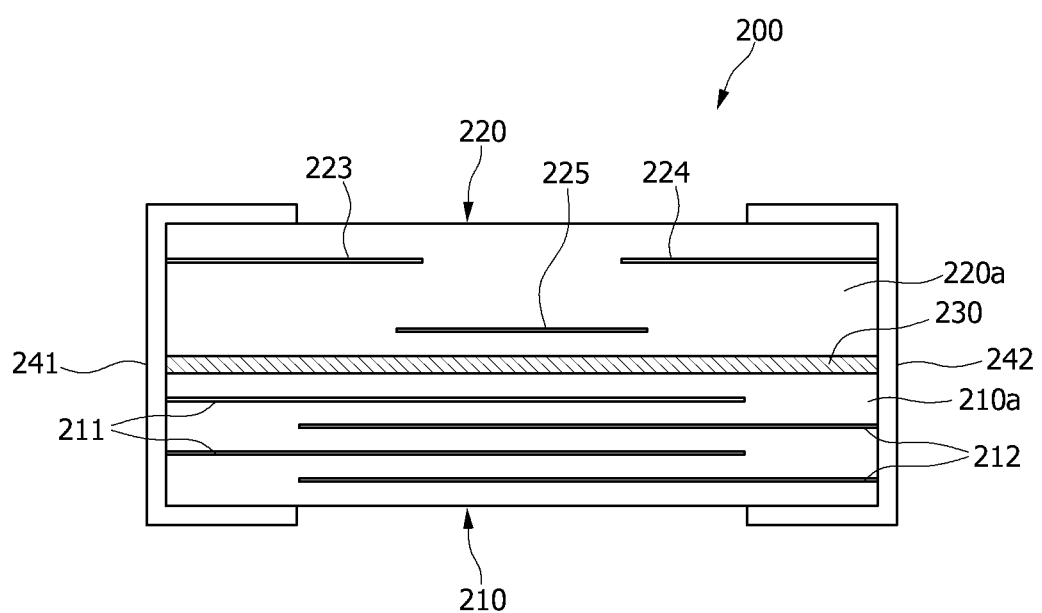
FIG. 9 is a cross-sectional view illustrating an electric shock protection device according to another embodiment of the present invention.
Figure 10:
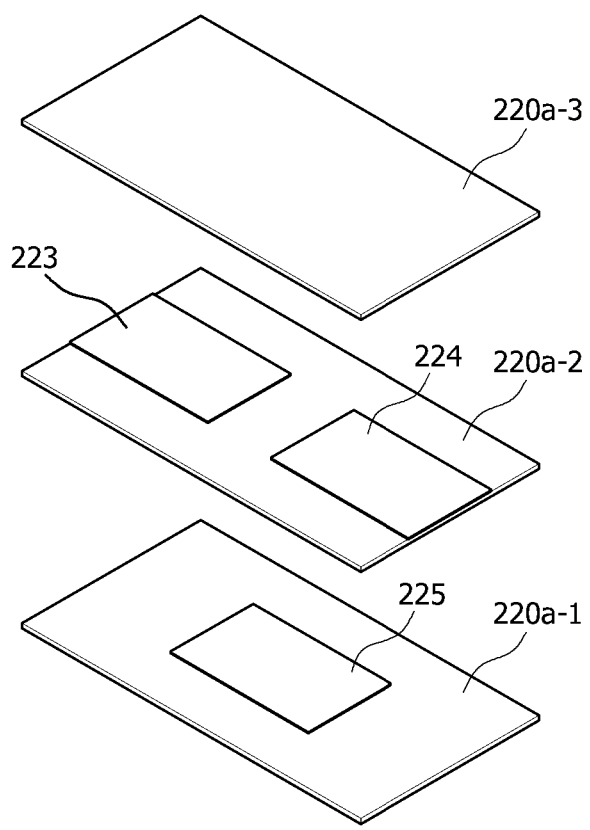
FIG. 10 is an exploded perspective view illustrating a stacking relationship in a varistor unit of FIG. 9.

As illustrated in FIGS. 9 and 10, the varistor unit 220 includes a plurality of varistor layers 220a-1 to 220a-3, at least two first internal electrodes 223 and 224 provided to be spaced a predetermined distance from each other on one varistor layer 220a-2 among the plurality of varistor layers 220a, and at least one second internal electrode 225 which is provided on the varistor layer 220a-1, which is different from the plurality of first internal electrodes 223 and 224.

Since the varistor unit 220 is the same as the varistor 120 described with reference to FIG. 2 except external electrodes 121 and 122, a specific description thereof will be omitted.

Here, as described above, in a case in which the above-described varistor is used to form the external electrodes 121 and 122, the varistor unit 220 may be formed to have a thickness which is greater than a thickness of the capacitor unit 210, but is not limited thereto, and the capacitor unit 210 and the varistor unit 220 may be formed to have the thicknesses which are the same or similar so as to constantly standardize an overall package.

The insulating layer 230 is provided between the capacitor unit 210 and the varistor unit 220. The insulating layer 230 is for separating the capacitor unit 110 from the varistor unit 220. As an example, the insulating layer 230 may include an epoxy.

Accordingly, in a case in which the capacitor unit 210 and the varistor unit 220 are fired, since the capacitor unit 210 is not in direct contact with the varistor unit 220, substitution and diffusion of material components forming the capacitor unit 210 and the varistor unit 220 are prevented, and thus a change in a dielectric constant of the capacitor unit 210 and a change in characteristics of the varistor unit 220 may be prevented.

Here, an area of the capacitor unit 210 may be the same as an area of the varistor unit 220. That is, since the capacitor unit 210 and the varistor unit 220 are connected through only the terminal electrodes 241 and 242, widths and lengths of the capacitor unit 210 and the varistor unit 220 may be the same.

Figure 11:
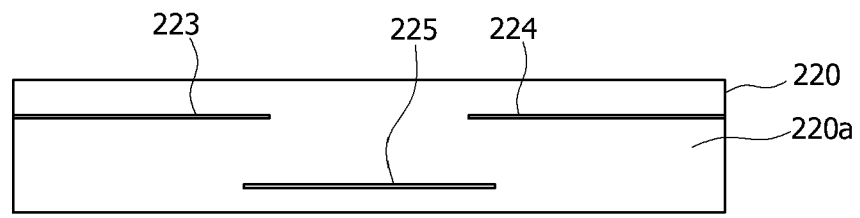
FIG. 11 is a cross-sectional view illustrating a state before the varistor unit is coupled to a capacitor unit in FIG. 9.
Figure 11:
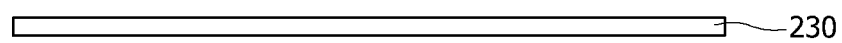
Figure 11:
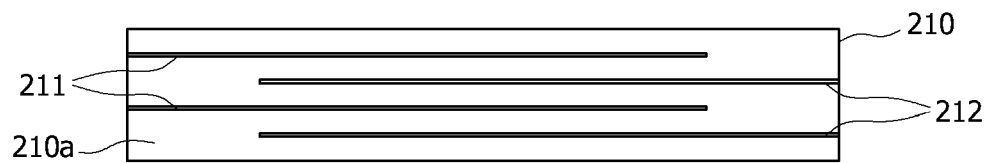
Figure 12:
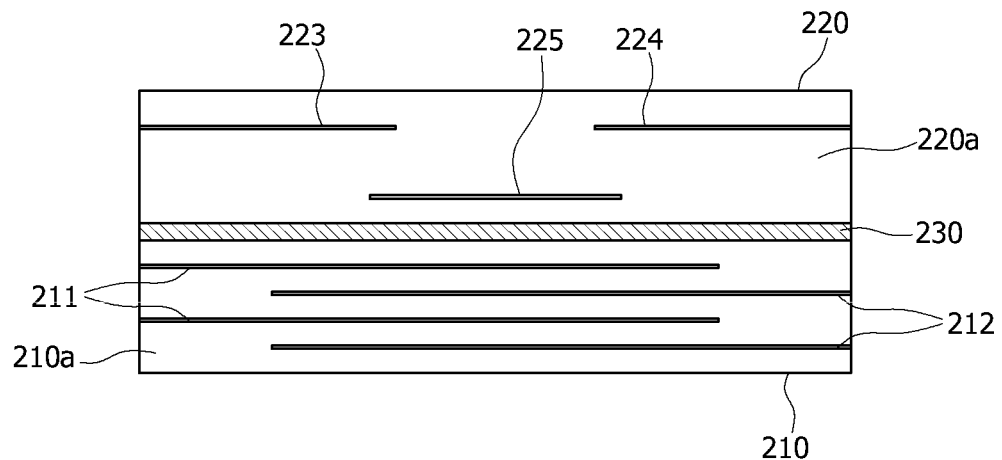
FIG. 12 is a cross-sectional view illustrating a state in which the varistor unit and the capacitor unit in FIG. 11 are coupled.

Meanwhile, as illustrated in FIG. 11, the capacitor unit 210 and the varistor unit 220 may be coupled using the insulating layer 230 after being manufactured through separate firing processes, or as illustrated in FIG. 12, the capacitor unit 210, the varistor unit 220, and the insulating layer 230 may be coupled through a single firing process after the insulating layer 230 is interposed between the capacitor unit 210 and the varistor unit 220, and the capacitor unit 210 and the varistor unit 220 are stacked.

The terminal electrodes 241 and 242 are provided at the both sides of the capacitor unit 210 and the varistor unit 220, and each of the terminal electrodes 241 and 242 is connected to one among the plurality of capacitor electrodes 211 and 212, the first internal electrodes 223 and 224, and the second internal electrode 225 (see FIG. 9)

As described above, since the capacitor electrodes 211 and 212 of the capacitor unit 210 and the first internal electrodes 223 and 224 or the second internal electrode 225 of the varistor unit 220 are connected through only the terminal electrodes 241 and 242, inhomogeneity, which may occur in a case in which the capacitor electrodes 211 and 212 of the capacitor unit 210 and the first internal electrodes 223 and 224 or the second internal electrode 225 of the varistor unit 220 are connected through via holes, of the connecting portions is suppressed, and ESD due to the electrode connecting portions can be prevented, and thus resistance to static electricity can be improved.

The electric shock protection device 100 or 200 may be disposed such that a conductor such as an external metal case is electrically connected to a circuit part in a portable electronic device. Here, the electric shock protection device 100 or 200 may be directly connected to a ground of the circuit part so that static electricity introduced due to the varistor 120 or 220 being turned on is not transmitted to the circuit potion and can bypass to the ground.

Optionally, in a case in which the electric shock protection device 100 or 200 is not directly connected to the ground of the circuit part, that is, in a case in which the conductor and the circuit part are electrically connected so that static electricity only passes therethrough, the portable electronic device may include a separate protection element such that the static electricity bypasses to the ground. The protection element may be a suppressor or a varistor formed as a single element.

In addition, in the electric shock protection device 100 or 200, in a case in which a leakage current of an external power source is introduced through the ground of the circuit part, the varistor 120 or 220 can be turned off, and the leakage current can be blocked so that the leakage current is not transmitted to the conductor through the capacitor unit 110 or 210.

In addition, in the electric shock protection device 100 or 200, in a case in which the conductor is formed as a part of an antenna, a communication signal introduced through the conductor may pass through the capacitor unit 110 or 210. In this case, since the varistor 120 or 220 is turned off, the electric shock protection device 100 or 200 can serve as a capacitor.

Here, the portable electronic device may be portable and capable of being easily carried. As an example, the portable electronic device may be a mobile terminal such as a smartphone, and a cellular phone, a smart watch, a digital camera, a digital multimedia broadcasting (DMB) terminal, an e-book, a netbook, a tablet personal computer (PC), a portable computer, or the like. Such electronic devices may include any suitable electronic components including antenna structures for communication with external devices. In addition, the electronic devices may be devices using short range communication such as Wi-Fi and Bluetooth.

Here, the conductor may include a pointed portion formed to protrude outward from a conductive case. As an example, the conductor may include a side key. In addition, the pointed portion may include one end portion of an insertion hole, into which for example, an earphone, a charging cable, a data cable, or the like is inserted, of a connector for being connected to an external device.

That is, in the electric shock protection device 100 or 200 according to the embodiment of the present invention, in a case in which a portion protruding outward or a portion having a pointed shape which has a high possibility of static electricity being introduced therethrough is connected to a circuit part, resistance to ESD, temperature characteristics, and capacitance capacity can be improved together.

While the embodiments of the present invention have been described above, the spirit of the present invention is not limited to the embodiments proposed in this specification, and other embodiments may be easily suggested by adding, changing, and deleting components by those skilled in the art, and the other embodiments will fall within the spiritual range of the present invention.

What is claimed is:
1. An electric shock protection device comprising:
a capacitor unit which includes a plurality of sheet layers and a plurality of capacitor electrodes provided on the sheet layers and has an electric shock prevention function and a communication signal transmission function;
a pair of soldering electrodes which are formed on the sheet layer disposed at an outermost side among the plurality of sheet layers, extend from both ends toward a center of the capacitor unit, and are formed as electrodes for co-firing;

a pair of terminal electrodes which are provided at both ends of the plurality of sheet layers and connect the plurality of capacitor electrodes to the pair of soldering electrodes;

a varistor which is connected to the pair of soldering electrodes through solders and is formed as a single component; and a molding portion which is molded on the varistor, the pair of soldering electrodes, and one side of each of the terminal electrodes, wherein the pair of terminal electrodes comprises:
first portions which are provided to cover parts of the soldering electrodes;
second portions which face the first portions and are provided to cover parts of one surface of the capacitor unit; and
third portions which connect the first portions and the second portions.

2. The electric shock protection device of claim 1, wherein:
the electrode for co-firing includes Ag and Pd, or Ag and Pt; and
the pair of terminal electrodes include at least one among Ag, Pt, Pd, Cu, and Ni.

3. The electric shock protection device of claim 1, wherein:
the pair of soldering electrodes are spaced 100 μm or more from each other; and
a distance between the pair of soldering electrodes is less than a distance between external electrodes of the varistor.

4. The electric shock protection device of claim 1, wherein:
a thickness of the molding portion ranges from 20 μm to 50 μm greater than a thickness of the varistor; and
the thickness of the varistor is greater than a thickness of the capacitor unit.

5. The electric shock protection device of claim 1, wherein:
a width of the first portion is the same as a width of the second portion;
the width is 50 μm or more; and
a distance between the first portions of the pair of terminal electrodes is greater than or equal to a length of the varistor.

6. The electric shock protection device of claim 1, wherein the varistor includes:
a plurality of varistor layers;
at least two first internal electrodes provided on one varistor layer among the plurality of varistor layers and spaced a predetermined distance from each other;
at least one second internal electrode provided on a varistor layer, which is different from the plurality of first internal electrodes; and
a pair of external electrodes which are provided at both sides of the plurality of varistor layers and in which one of the first internal electrodes and the second internal electrodes is connected to one of the pair of external electrodes.

7. A method of manufacturing an electric shock protection device, the method comprising:
stacking a plurality of sheet layers on which capacitor electrodes are provided;
applying an electrode paste for co-firing on the sheet layer disposed at an outermost side among the plurality of sheet layers from both ends toward a center of the plurality of sheet layers;
firing the plurality of sheet layers;
forming a pair of terminal electrodes at the both ends of the plurality of sheet layers such that a pair of soldering electrodes formed of the electrode paste for co-firing are connected to the plurality of capacitor electrodes;
soldering a varistor formed as a single component onto the pair of soldering electrodes; and
molding a molding member on the varistor, the pair of soldering electrodes, and one side of each of the terminal electrodes,
wherein the forming of the terminal electrodes comprises forming the pair of terminal electrodes such that:
first portions cover parts of the soldering electrodes;
second portions face the first portions and cover a part of one surface of the sheet layer disposed at the outermost side; and
third portions connect the first portions to the second portions.

8. The method of claim 7, wherein the electrode paste for co-firing includes Ag and Pd, or Ag and Pt.

9. The method of claim 7, wherein the applying includes applying the paste such that, after the firing:
the pair of soldering electrodes are spaced 100 μm or more from each other; and
a distance between the pair of soldering electrodes is less than a distance between external electrodes of the varistor.

10. The method of claim 7, wherein the forming of the terminal electrodes includes forming the terminal electrodes such that:
a width of the first portion is the same as a width of the second portion;
the width is 50 μm or more; and
a distance between the first portions of each of the pair of terminal electrodes is greater than or equal to a length of the varistor.

* * * * *